US012633324B2

(12) United States Patent
Seo et al.

(10) Patent No.: US 12,633,324 B2
(45) Date of Patent: May 19, 2026

(54) DEVICE INCLUDING INPUT/OUTPUT CIRCUIT, A SYSTEM INCLUDING THE DEVICE, AND AN OPERATING METHOD OF THE SYSTEM

(71) Applicant: SAMSUNG ELECTRONICS CO., LTD., Suwon-si (KR)

(72) Inventors: Jungmin Seo, Suwon-si (KR); Cheonan Lee, Daejeon (KR); Sukkang Sung, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 18/544,550

(22) Filed: Dec. 19, 2023

(65) Prior Publication Data

US 2024/0212726 A1    Jun. 27, 2024

(30) Foreign Application Priority Data

Dec. 22, 2022    (KR) ........................ 10-2022-0182188

(51) Int. Cl.
 *G11C 7/10*    (2006.01)
(52) U.S. Cl.
 CPC .................................. *G11C 7/1048* (2013.01)
(58) Field of Classification Search
 CPC .................................................... G11C 7/1048
 USPC .................................................... 365/189.18
 See application file for complete search history.

(56) References Cited

U.S. PATENT DOCUMENTS

| | | | | |
|---|---|---|---|---|
| 5,982,705 | A | 11/1999 | Tsukikawa | |
| 6,028,450 | A * | 2/2000 | Nance .............. | H03K 19/00315 |
| | | | | 326/50 |
| 6,329,842 | B1 * | 12/2001 | Naritomi .......... | H03K 19/00315 |
| | | | | 326/83 |
| 6,384,632 | B2 | 5/2002 | Tsuji | |
| 7,809,864 | B1 * | 10/2010 | Young .................... | G06F 1/266 |
| | | | | 710/36 |
| 9,136,835 | B2 | 9/2015 | Arai | |
| 9,251,866 | B2 | 2/2016 | Chun | |
| 11,062,760 | B1 | 7/2021 | Koh | |

FOREIGN PATENT DOCUMENTS

| | | |
|---|---|---|
| KR | 10-2001-0073708 | 8/2001 |
| KR | 10-0296612 | 8/2001 |
| KR | 10-2003-0016401 | 2/2003 |

* cited by examiner

*Primary Examiner* — Anthan Tran
(74) *Attorney, Agent, or Firm* — Morgan, Lewis & Bockius LLP

(57) ABSTRACT

A device includes an input/output circuit, wherein the input/output circuit includes: a control circuit configured to receive a signal indicating whether the device is activated; a variable voltage source configured to generate a variable voltage according to a control operation of the control circuit based on the signal received by the control circuit; an output driver including a first transistor and a second transistor; and a pad configured to output a current that is generated by the output driver, and wherein the variable voltage source is configured to provide the variable voltage to a body of the first transistor and a body of the second transistor.

20 Claims, 11 Drawing Sheets

Figure 7:
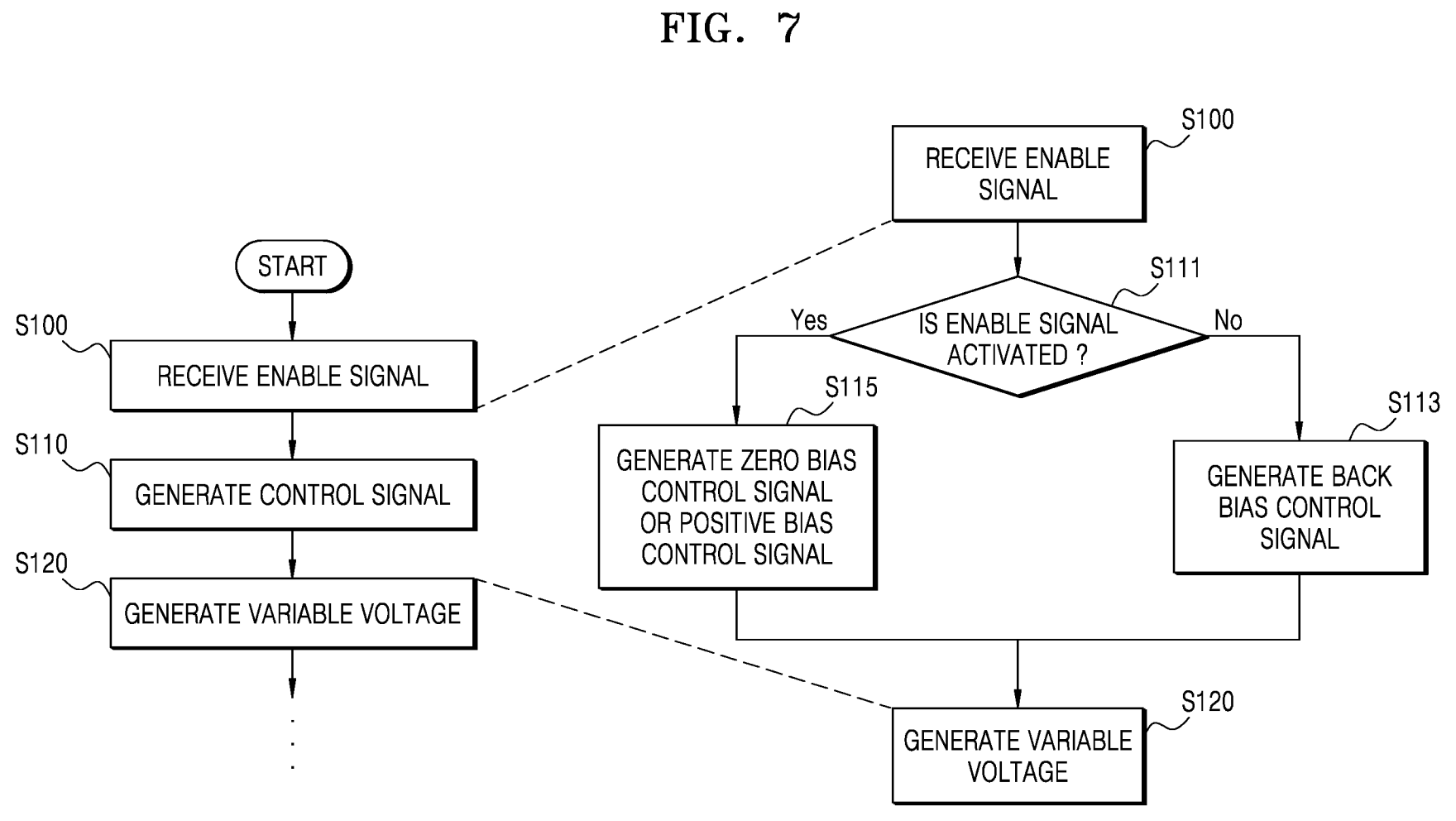

START

RECEIVE ENABLE SIGNAL — S100

GENERATE CONTROL SIGNAL — S110

GENERATE VARIABLE VOLTAGE — S120

. . .

RECEIVE ENABLE SIGNAL — S100

IS ENABLE SIGNAL ACTIVATED ? — S111

No

GENERATE BACK BIAS CONTROL SIGNAL — S113

Yes

GENERATE ZERO BIAS CONTROL SIGNAL OR POSITIVE BIAS CONTROL SIGNAL — S115

GENERATE VARIABLE VOLTAGE — S120

FIG. 8

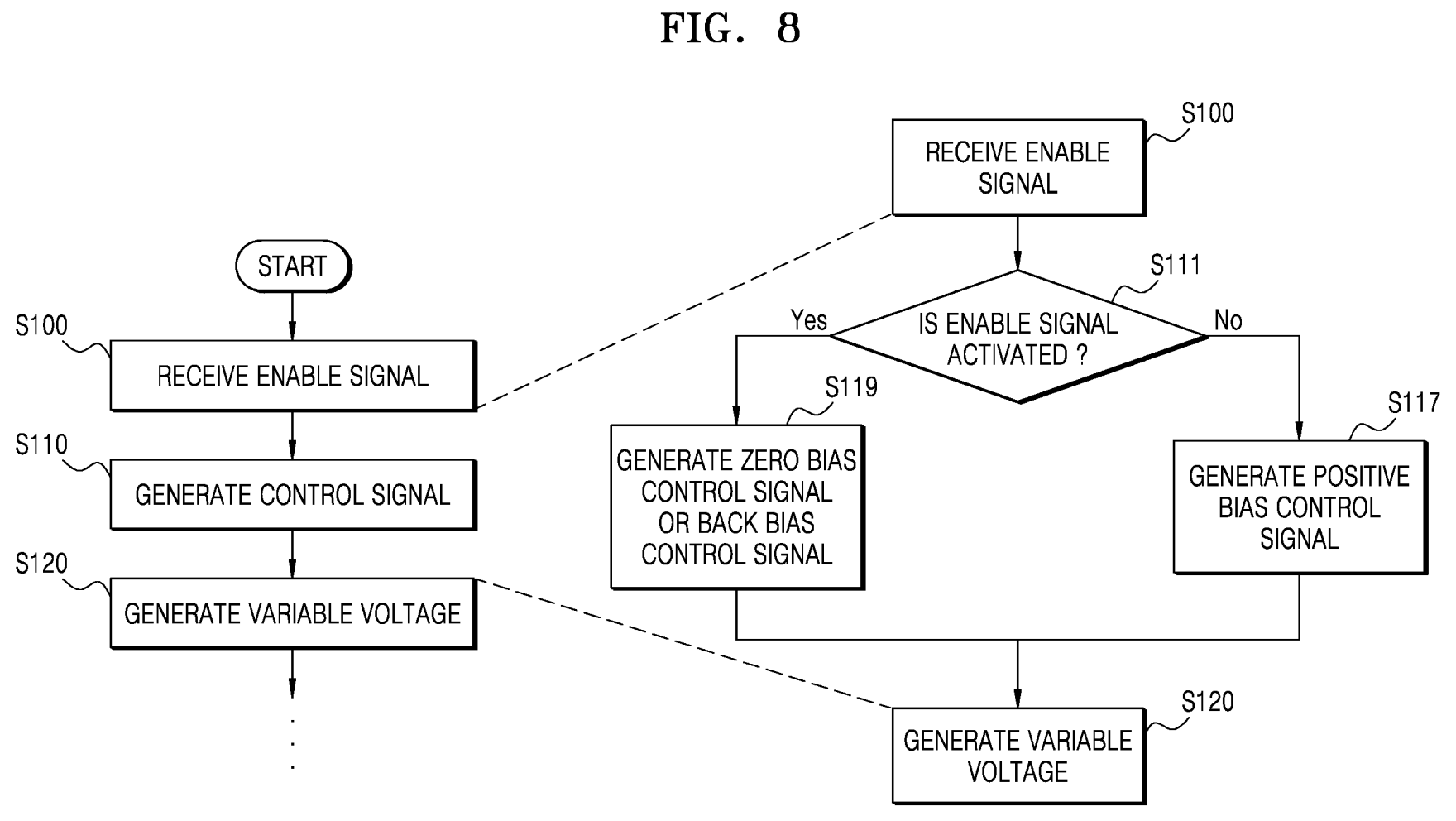

START

RECEIVE ENABLE SIGNAL — S100

GENERATE CONTROL SIGNAL — S110

GENERATE VARIABLE VOLTAGE — S120

· · ·

RECEIVE ENABLE SIGNAL — S100

IS ENABLE SIGNAL ACTIVATED ? — S111

No → GENERATE POSITIVE BIAS CONTROL SIGNAL — S117

Yes → GENERATE ZERO BIAS CONTROL SIGNAL OR BACK BIAS CONTROL SIGNAL — S119

GENERATE VARIABLE VOLTAGE — S120

Figure 11:
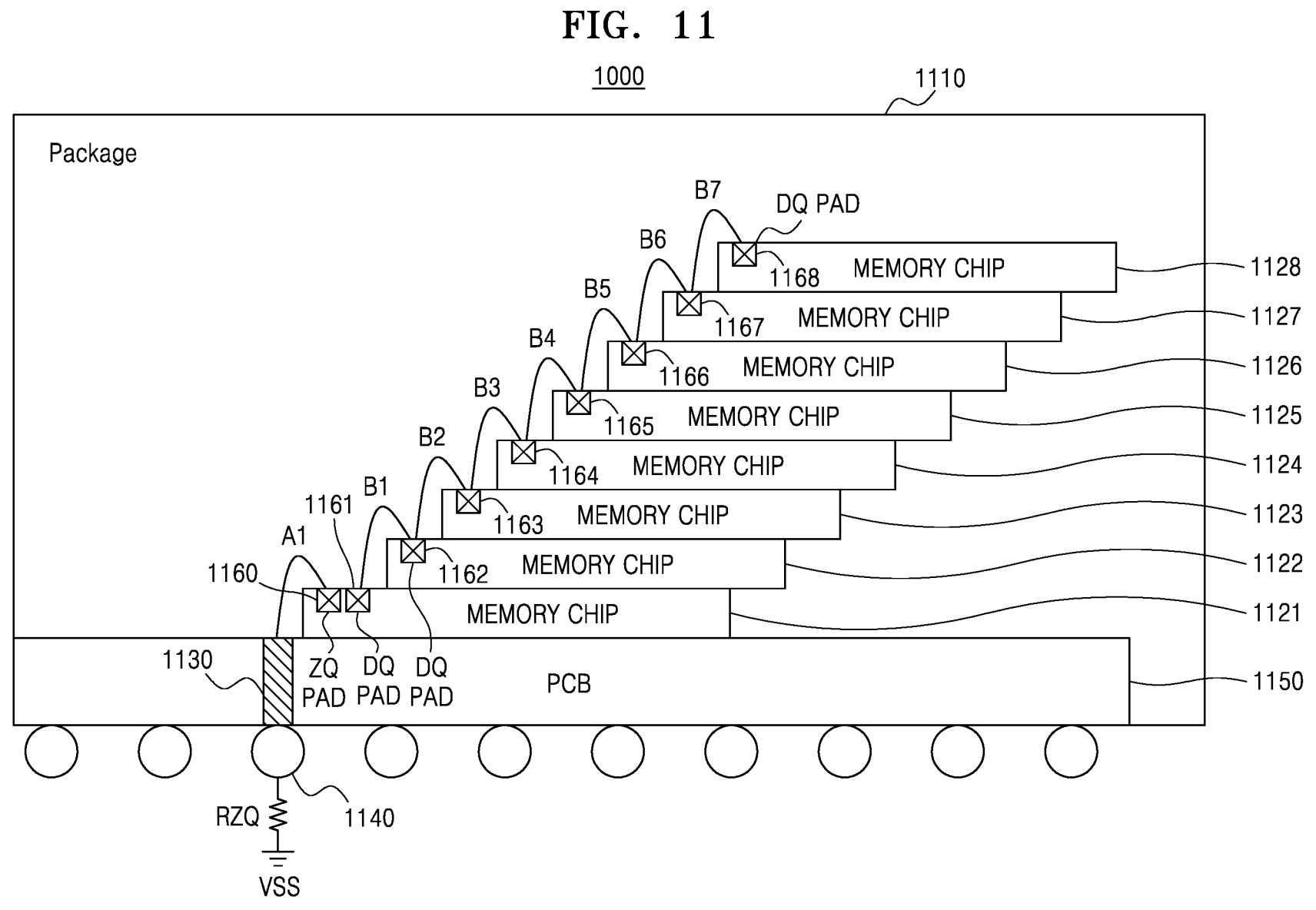

Package

1110

MEMORY CHIP 1128
MEMORY CHIP 1127
MEMORY CHIP 1126
MEMORY CHIP 1125
MEMORY CHIP 1124
MEMORY CHIP 1123
MEMORY CHIP 1122
MEMORY CHIP 1121

DQ PAD 1168    B7
1167    B6
1166    B5
1165    B4
1164    B3
1163    B2
1162    B1
1161    A1
1160

PCB 1150

ZQ    DQ    DQ
PAD  PAD  PAD

1130

1140

RZQ

VSS

DEVICE INCLUDING INPUT/OUTPUT CIRCUIT, A SYSTEM INCLUDING THE DEVICE, AND AN OPERATING METHOD OF THE SYSTEM

CROSS-REFERENCE TO RELATED APPLICATION

This application claims priority under 35 U.S.C. § 119 to Korean Patent Application No. 10-2022-0182188, filed on Dec. 22, 2022, in the Korean Intellectual Property Office, the disclosure of which is incorporated by reference herein in its entirety.

TECHNICAL FIELD

The present inventive concept relates to a device, a system including the device, and an operating method of the system, and more particularly, to a device including an input/output circuit, a system including the device, and an operating method of the system.

DISCUSSION OF THE RELATED ART

As semiconductor technology advances, the degree of integration of devices increases, throughput of data increases, and demand for increasing input/output performance of devices increases. For example, various methods for increasing a data transmission speed of a device have been under development, and an input/output operating speed of a device may have a great effect on such performance increase.

In particular, to increase the input/output operating speed of a device, it may be desirable to distinguish the device that is actually performing an input/output operation from the device that is not performing an input/output operation and to control the device in conjunction with a distinction result.

In addition, as a miniaturization process for higher performance of a semiconductor device gradually progresses, leakage current of a semiconductor device may gradually increase. Control of the leakage current is very desirable for reducing power consumption. As such, technology for increasing the operating speed and reducing power consumption of devices is under development.

SUMMARY

According to an embodiment of the present inventive concept, a device includes an input/output circuit, wherein the input/output circuit includes: a control circuit configured to receive a signal indicating whether the device is activated; a variable voltage source configured to generate a variable voltage according to a control operation of the control circuit based on the signal received by the control circuit; an output driver including a first transistor and a second transistor; and a pad configured to output a current that is generated by the output driver, and wherein the variable voltage source is configured to provide the variable voltage to a body of the first transistor and a body of the second transistor.

According to an embodiment of the present inventive concept, a method of inputting and outputting data from a device includes: receiving an enable signal that indicates whether the device is activated; generating a control signal in response to the enable signal; generating a variable voltage based on the control signal; applying the variable voltage to bodies of output transistors; and outputting a current that is generated by the output transistors.

According to an embodiment of the present inventive concept, a system includes: a first chip; and a controller electrically connected to the first chip, wherein an input/output circuit of the first chip includes: a control circuit configured to receive, from the controller, an enable signal that indicates whether the first chip is activated; a variable voltage source configured to generate a variable voltage according to a control operation of the control circuit based on the enable signal; a driver including a pull-up transistor and a pull-down transistor; and a pad configured to output a current that is generated by the driver, and wherein the variable voltage source provides the variable voltage to a body of the pull-up transistor and a body of the pull-down transistor.

BRIEF DESCRIPTION OF THE DRAWINGS

The above and other aspects of the present inventive concept will become more apparent by describing in detail embodiments thereof, with reference to the accompanying drawings, in which:

FIG. 1 is a block diagram illustrating a memory system according to an embodiment of the present inventive concept;

FIG. 4 is a cross-sectional view of transistors of FIG. 3;

FIGS. 7 and 8 are flowcharts illustrating a process of generating a control signal according to an embodiment of the present inventive concept;

FIG. 10 is a diagram illustrating a system to which memory and/or a storage device according to an embodiment of the present inventive concept is applied; and FIG. 11 is a diagram illustrating a multi-chip package according to an embodiment of the present inventive concept.

DETAILED DESCRIPTION OF THE EMBODIMENTS

Figure 2:
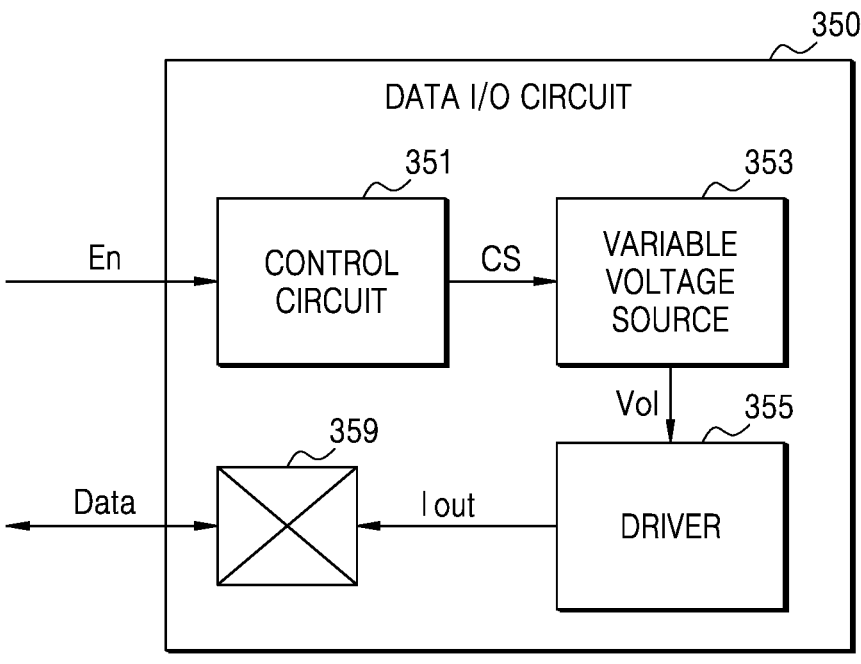
FIG. 2 is a block diagram illustrating a data input/output circuit according to an embodiment of the present inventive concept.

Hereinafter, embodiments of the present inventive concept will be described in detail with reference to the accompanying drawings.

Figure 1:
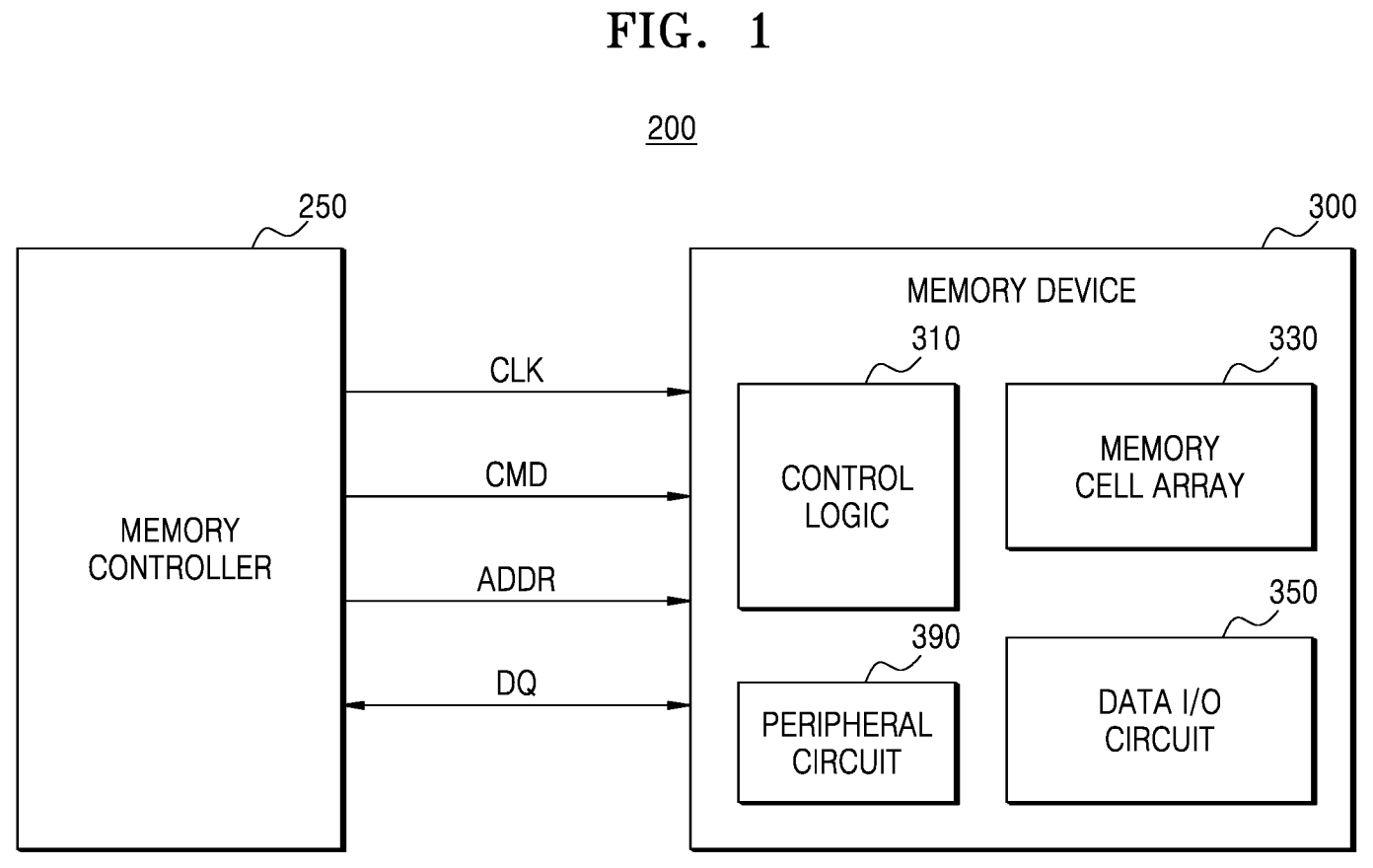

FIG. 1 is a block diagram illustrating a memory system 200 according to an embodiment of the present inventive concept.

Referring to FIG. 1, in some embodiments of the present inventive concept, the memory system 200 including an input/output circuit according to an embodiment of the present inventive concept may include a memory controller 250 and a memory device 300. The memory device 300 may include a control logic 310, a memory cell array 330, a data input/output circuit 350, and a peripheral circuit 390. The memory system 200 may be applied to memories 20a to 20b and/or storage devices 30a to 30b of FIG. 10, which is to be described later.

However, the present inventive concept is not limited thereto. For example, the input/output circuit according to an embodiment of the present inventive concept may be widely implemented in various devices capable of performing input/output operations (for example, input/output operations of data or signals) as well as memory devices. Hereinafter, for convenience of description, an input/output circuit that is applied to a memory device will be described as an example.

The memory controller 250 may control general memory operations such as writing to and reading from the memory cell array 330 by providing various signals such as a clock signal CLK, a command CMD, an address ADDR, and a data signal DQ to the memory device 300. For example, the memory controller 250 may write data to or read data from the memory device 300 based on the data signal DQ by providing the command CMD and the address ADDR to the memory device 300.

In some embodiments of the present inventive concept, the command CMD may include an enable signal as described later. For example, the command CMD may include an activated enable signal for switching the memory device 300 into an activation state for writing to or reading data from (for example, for performing an input/output operation with the memory device 300) the memory device 300 based on the data signal DQ. The memory device 300 may activate word lines included in the memory cell array 330 in response to the activated enable signal. Similarly, the command CMD may include a deactivated enable signal for deactivating the memory device 300 (for example, for not performing the input/output operation with the memory device 300) after data writing or reading is completed or when the memory cell array 330 is not used.

The control logic 310 may generally control various operations in the memory device 300. The control logic 310 may output various control signals in response to the command CMD and/or the address ADDR from the memory controller 250. For example, the control logic 310 may output a voltage control signal, a row address, and a column address. In addition, in an embodiment of the present inventive concept, the control logic 310 may activate or deactivate the memory cell array 330 of the memory device 300 through the enable signal that is included in the command CMD.

The memory cell array 330 may include a plurality of memory blocks, and each of the plurality of memory blocks may include a plurality of memory cells. The memory cell array 330 may be connected to a page buffer through bit lines, and may be connected to a row decoder through the word lines, string selection lines, and ground selection lines. In an embodiment of the present inventive concept, the memory cell array 330 may include a three-dimensional memory cell array, and the three-dimensional memory cell array may include a plurality of NAND strings. Each of the plurality of NAND strings may include memory cells respectively connected to the word lines that are vertically stacked on a substrate. In an embodiment of the present inventive concept, the memory cell array 330 may include a two-dimensional memory cell array, and the two-dimensional memory cell array may include the plurality of NAND strings arranged in row and column directions.

The data input/output circuit 350 may receive data to be written from the memory controller 250, may write the data to the memory cell array 330, and may provide data that is output from the memory cell array 330 to the memory controller 250. In some embodiments of the present inventive concept, the data input/output circuit 350 may operate in conjunction with the enable signal as described later. For example, the data input/output circuit 350 may receive the enable signal through a control circuit 351 of FIG. 2 to perform a control operation according to an embodiment of the present inventive concept. However, the present inventive concept is not limited thereto. For example, the control circuit 351, which controls the data input/output circuit 350, may be included in the control logic 310 to perform the input/output operation according to an embodiment of the present inventive concept. A detailed configuration and operation of the data input/output circuit 350 will be described later.

The peripheral circuit 390 may include various circuits for the memory device 300 and to perform a function. For example, the peripheral circuit 390 may include a column decoder and the row decoder to access the memory cell array 330 through the column decoder and the row decoder. In addition, the peripheral circuit 390 may include an error correction code (ECC) block and an impedance calibration circuit. The data input/output circuit 350 may drive bits of data, which are provided from the ECC block, based on a pull-up control code and/or a pull-down control code, which are provided from the impedance calibration circuit, to output data having a constant voltage to the memory controller 250 through a data input/output pad 359 (refer to FIG. 2).

FIG. 2 is a block diagram illustrating a data input/output circuit 350 according to an embodiment of the present inventive concept.

Referring to FIGS. 1 and 2, the data input/output circuit 350 may include the control circuit 351, a variable voltage source 353, a driver 355, and the data input/output pad 359. In some embodiments of the present inventive concept, the control circuit 351 may generate a control signal CS in conjunction with the enable signal En (or a chip activation signal), and the variable voltage source 353 may generate a variable voltage Vol based on the control signal CS and may apply the variable voltage Vol to the driver 355 to reduce parasitic capacitance when a device including the data input/output circuit 350 is not in use.

For example, the control circuit 351 may receive the enable signal En from the outside (for example, the memory controller 250 or the control logic 310). As described above, the enable signal En may activate the memory device 300 to perform the input/output operation. As described later in detail with reference to FIG. 3, the control circuit 351 may generate the control signal CS so that the variable voltage source 353 generates the variable voltage Vol based on whether the enable signal En is activated or not. In some embodiments of the present inventive concept, the control signal CS may include control information on which a variable voltage among a positive voltage, a zero voltage, and a negative voltage is to be generated by the variable voltage source 353. For example, according to the control signal CS that is generated by the control circuit 351, the variable voltage Vol that is generated by the variable voltage source 353 may include a back-bias voltage. In addition, in some embodiments of the present inventive concept, the control signal CS may include control information of a magnitude of the variable voltage Vol. For example, the control information of the magnitude of the variable voltage Vol may be based on a preset value or may be adjusted under user control.

The variable voltage source 353 may generate the variable voltage Vol (or may vary the voltage) based on the control signal CS. In some embodiments of the present inventive concept, the variable voltage Vol, which is generated by the variable voltage source 353, may be implemented in various forms from a voltage lower than a reference voltage (for example, a ground voltage VSS in FIG. 3) to a voltage higher than a power supply voltage VDDQ in FIG. 3. For example, the variable voltage source 353 may reduce or increase the variable voltage Vol to a reliable voltage tolerance through a charge pump. The variable voltage source 353 may apply the generated variable voltage Vol to the driver 355.

The variable voltage Vol may be applied to transistors that are included in the driver 355. As described later in detail with reference to FIG. 3, threshold voltages, leakage currents, standby currents, and driving strengths of the transistors included in the driver 355, and/or parasitic capacitance of the data input/output circuit 350 may be adjusted based on the variable voltage Vol that is applied to bodies of the transistors included in the driver 355. The driver 355 may generate a current $I_{out}$ through the transistors, and the current $I_{out}$ output by the driver 355 may be transmitted to an on-die termination (ODT) resistor $R_{ODT}$ of the memory controller 250 through the data input/output pad 359 as described later in detail with reference to FIG. 5. Data DATA that is received by the memory controller 250 may be determined by the current $I_{out}$ that is generated by the driver 355 and the ODT resistor.

Figure 3:
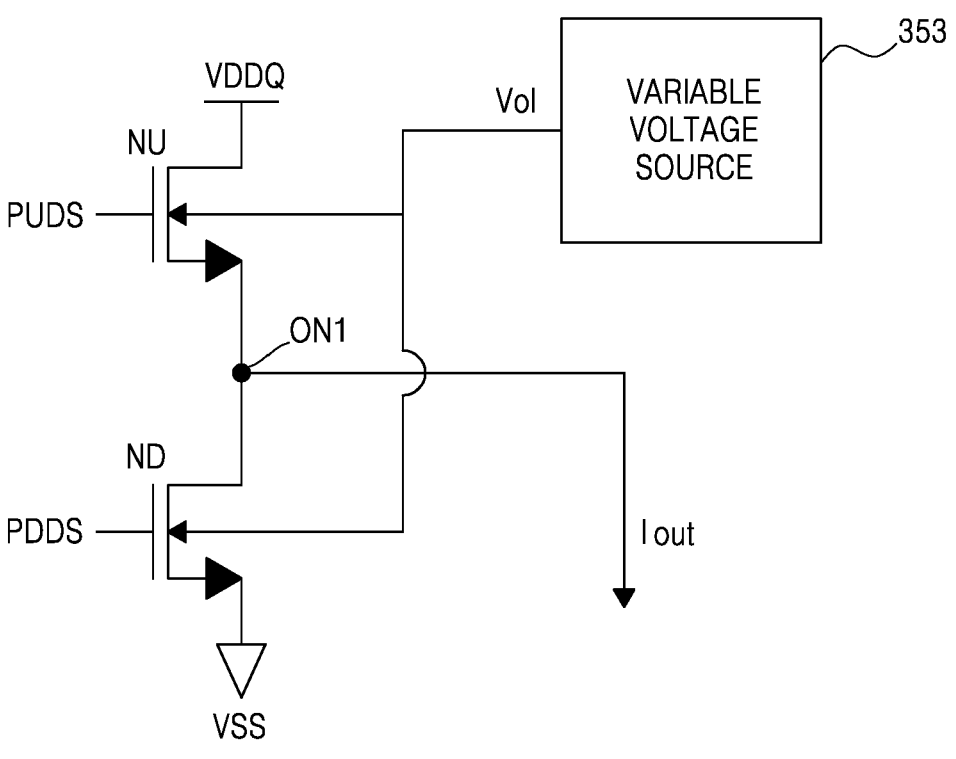
FIG. 3 is a circuit diagram illustrating a control operation of the data input/output circuit of FIG. 2.

FIG. 3 is a circuit diagram illustrating a control operation of the data input/output circuit 350 of FIG. 2.

Referring to FIGS. 1 to 3, the variable voltage source 353 of the data input/output circuit 350 may generate the variable voltage Vol and may apply the variable voltage Vol to bodies of the transistors of the driver 355.

In some embodiments of the present inventive concept, the transistors included in the driver 355 may include n-channel metal oxide semiconductor (NMOS) transistors. For example, the driver 355 may include a pull-up transistor NU and a pull-down transistor ND, each of which include NMOS transistors. The pull-up transistor NU may be connected between the power supply voltage VDDQ and a first output node ON1, and the pull-down transistor ND may be connected between the first output node ON1 and a reference voltage (for example, the ground voltage VSS). Each body of the pull-up transistor NU and the pull-down transistor ND may be connected to the variable voltage source 353 to receive the variable voltage Vol that is generated by the variable voltage source 353. The pull-up transistor NU and the pull-down transistor ND may generate the current $I_{out}$ based on a pull-up driving signal PUDS and a pull-down driving signal PDDS.

In some embodiments of the present inventive concept, the variable voltage Vol generated by the variable voltage source 353 may be controlled based on the control signal CS that is generated by the control circuit 351. For example, when the memory device 300 is in an inactive state, for example, when the memory device 300 is not performing the input/output operation with the memory controller 250, the memory controller 250 may transmit the deactivated enable signal En to the control circuit 351. When the control circuit 351 receives the deactivated enable signal En, the control circuit 351 may generate the control signal CS causing the variable voltage source 353 to generate a back bias voltage, for example, a negative bias voltage. As described above, the back bias voltage generated by the variable voltage source 353 may be lower than the ground voltage VSS. In addition, as described above, a magnitude of the back bias voltage generated by the variable voltage source 353 may be based on a preset value or may be adjusted under user control. For example, when the memory device 300 is in an inactive state, the data input/output circuit 350 may apply the back bias voltage to the bodies of the pull-up transistor NU and the pull-down transistor ND by controlling the variable voltage Vol that is generated by the variable voltage source 353.

As such, when the back bias voltage is applied to the bodies of the NMOS transistors, as described later with reference to FIG. 4, a junction width may be increased by increasing depletion regions of the NMOS transistors so that pad capacitance (e.g., junction capacitance or parasitic capacitance of the circuit) may be reduced. As a result, when memory is not in use or operating, because the pad capacitance may be reduced by applying the back bias voltage to a corresponding output driver, an overall operating speed of the device may be increased as described later with reference to FIG. 9.

In addition, by applying the back bias voltage to the bodies of the NMOS transistors, threshold voltages of the NMOS transistors may be increased. Accordingly, when the memory is not in use or operating, leakage currents of the NMOS transistors may be reduced by increasing the threshold voltages of the NMOS transistors. Accordingly, power consumption may be reduced.

In some embodiments of the present inventive concept, when the memory device 300 is in an active state, for example, when the memory device 300 is performing the input/output operation with the memory controller 250, the memory controller 250 may transmit the activated enable signal En to the control circuit 351. When the control circuit 351 receives the activated enable signal En, the control circuit 351 may generate the control signal CS that is transmitted to the variable voltage source 353 that generates a voltage of 0, that is, a zero bias voltage in response to the control signal CS. For example, when the memory device 300 is in an active state, the data input/output circuit 350 may apply the zero bias voltage to the bodies of the pull-up transistor NU and the pull-down transistor ND by controlling the variable voltage Vol that is generated by the variable voltage source 353.

Accordingly, when the memory is to be used or operated, the zero bias voltage may be applied to the corresponding output driver. Therefore, because the junction width may be set to an existing value, the input/output circuit may be controlled so that the output driver may drive smoothly, that is, the memory may operate smoothly.

In some embodiments of the present inventive concept, when the memory device 300 is in an active state, for example, when the memory device 300 is performing the input/output operation with the memory controller 250, the memory controller 250 may transmit the activated enable signal En to the control circuit 351. When the control circuit 351 receives the activated enable signal En, the control circuit 351 may generate the control signal CS that causes the variable voltage source 353 to generate a positive voltage, that is, a positive bias voltage. As described above, the positive bias voltage, which is generated by the variable voltage source 353, may be higher than the power supply voltage VDDQ. In addition, as described above, a magnitude of the positive bias voltage, which is generated by the variable voltage source 353, may be based on a preset value or may be adjusted under user control. For example, when the memory device 300 is in an active state, the data input/output circuit 350 may apply the positive bias voltage to the bodies of the pull-up transistor NU and the pull-down transistor ND by controlling the variable voltage Vol that is generated by the variable voltage source 353.

Accordingly, when the memory is to be used or operated, by applying the positive bias voltage to the corresponding output driver, the threshold voltages of the NMOS transistors may be reduced. Therefore, because a larger amount of current may be generated with the same output driver size, the driving strength may be increased. In addition, although driving of the same strength is performed, the size of the output driver may be reduced. Because the pad capacitance may also be reduced by reducing the size of the output driver, the operating speed of the device may be increased.

Although the driver 355 is illustrated as including an NMOS transistor in the current embodiment, the present inventive concept is not limited thereto and may be implemented in various aspects. For example, the driver 355 may include p-channel metal oxide semiconductor (PMOS) transistors, and control operations may be performed accordingly as described later with reference to FIG. 8.

As a result, the input/output circuit may obtain the above-described effects by setting the variable voltage to vary according to whether the memory including the input/output circuit is in use or operating to apply the variable voltage to the output driver.

Figure 4:
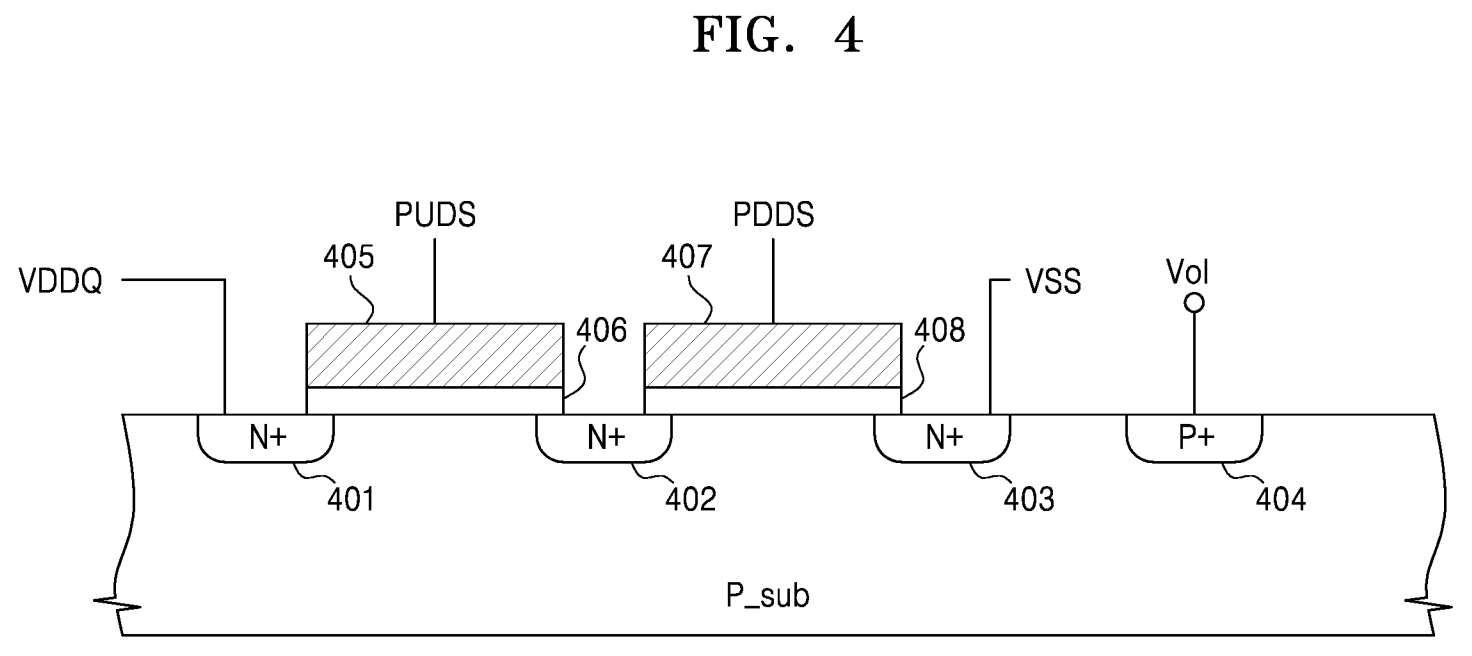

FIG. 4 is a cross-sectional view of the transistors of FIG. 3.

Referring to FIGS. 2 to 4, an n-type dopant may be implanted into a p-type substrate P_sub to form the NMOS transistors NU and ND. N+ doped regions 401 to 403 constituting drains or sources of the NMOS transistors NU and ND may be formed in the p-type substrate P_sub. In addition, a P+ doped region 404, which provides the variable voltage Vol to the bodies of the NMOS transistors NU and ND, may be formed in the p-type substrate P_sub. In addition, gate insulating layers 406 and 408 and gate electrodes 405 and 407 are sequentially stacked on the p-type substrate P_sub. The gate insulating layers 406 and 408 may include, for example, an oxide layer, a nitride layer, or a stacked layer in which the oxide layer and the nitride layer are stacked. In addition, the gate insulating layers 406 and 408 may include, for example, metal oxides having high dielectric constants, a stacked layer in which the metal oxides are stacked, or a mixed layer in which the metal oxides are mixed. In addition, the gate electrodes 405 and 407 may include, for example, a polysilicon layer or a metal layer doped with impurity ions (e.g., phosphor (P), arsenic (As), and boron (B)). A pull-up driving signal PUDS and a pull-down driving signal PDDS may be applied to the gate electrodes 405 and 407 of the NMOS transistors NU and ND, respectively, and the power supply voltage VDDQ and the ground voltage VSS may be applied to the N+ doped regions 401 and 403 constituting the drains or sources of the NMOS transistors NU and ND, respectively. In addition, the variable voltage Vol may be applied to the P+ doped region 404 that constitutes the bodies of the NMOS transistors NU and ND.

As such, the control operations described above with reference to FIG. 3 may be performed by controlling the variable voltage Vol that is applied to the bodies of the pull-up transistor NU and the pull-down transistor ND included in the driver 355, that is, the P+ doped region 404 in conjunction with whether the memory is operating, that is, whether the enable signal En is activated.

Although the structures of the NMOS transistors are illustrated in the current embodiment, the present inventive concept is not limited thereto and may be implemented in various aspects. For example, the driver 355 may include the PMOS transistors, and configurations may be changed accordingly.

Figure 5:
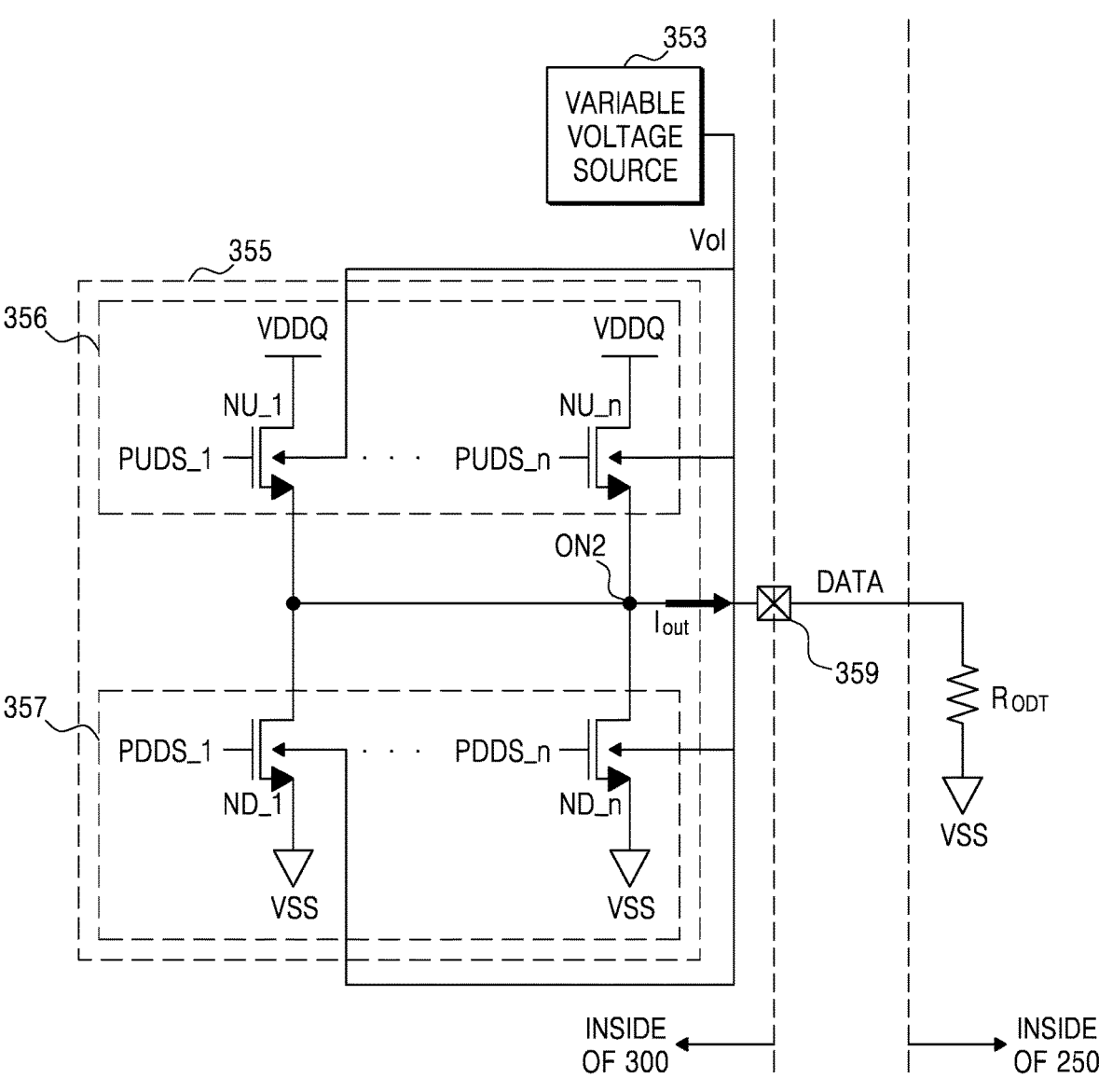
FIG. 5 is a circuit diagram illustrating a data output process according to an embodiment of the present inventive concept.

FIG. 5 is a circuit diagram illustrating a data output process according to an embodiment of the present inventive concept.

Referring to FIGS. 1 to 3, and S, the driver 355 may generate the current $I_{out}$ for outputting the data DATA based on the variable voltage Vol received from the variable voltage source 353. The driver 355 may include a pull-up driver 356 and a pull-down driver 357. The pull-up driver 356 may include n (n is a natural number greater than or equal to 1) pull-up transistors NU_1 to NU_n connected between the power supply voltage VDDQ and a second output node ON2. The pull-up transistors NU_1 to NU_n may include NMOS transistors. The pull-down driver 357 may include n pull-down transistors ND_1 to ND_n connected between the second output node ON2 and the ground voltage VSS. Each of the pull-down transistors ND_1 to ND_n may also include an NMOS transistor. As illustrated in FIG. 5, the variable voltage Vol generated by the variable voltage source 353 may be applied to each body of the pull-up transistors NU_1 to NU_n and the pull-down transistors ND_1 to ND_n.

In an embodiment of the present inventive concept, when data received by the data input/output circuit 350 is at a logic high level, the pull-up driver 356 may generate a current determined according to received pull-up driving signals PUDS_1 to PUDS_n. The pull-down transistors ND_1 to ND_n included in the pull-down driver 357 may be turned off in response to pull-down driving signals PDDS_1 to PDDS_n. As such, the current $I_{out}$ generated by the pull-up driver 356 and the pull-down driver 357 may be transmitted to the ODT resistor $R_{ODT}$ of the memory controller 250 through the data input/output pad 359. The data DATA received by the ODT resistor $R_{ODT}$ may be determined based on the current $I_{out}$ generated by the driver 355. In an embodiment of the present inventive concept, when the data received by the data input/output circuit 350 is at a logic low level, the pull-up transistors NU_1 to NU_n may be turned off in response to the pull-up driving signals PUDS_1 to PUDS_n. In this case, because the current $I_{out}$ generated by the driver 355 does not exist, the data DATA received by the ODT resistor $R_{OUT}$ through the data input/output pad 359 may have the same output low level as the ground voltage VSS.

As described above with reference to FIGS. 2 and 3, because the driver 355 operates based on the variable voltage Vol generated by the variable voltage source 353 in response to the control signal CS from the control circuit 351 that is generated based on whether the memory is operating through the enable signal En to properly control the leakage currents, the threshold voltages, and/or the pad capacitance, the current $I_{out}$ constituting the data DATA may be generated more efficiently and with increased speed and accuracy.

Figure 6:
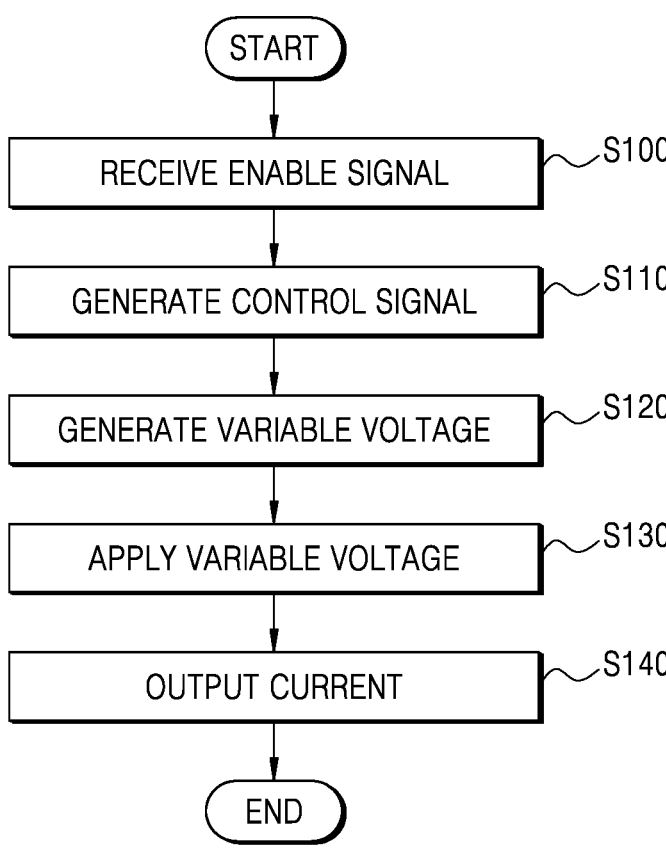
FIG. 6 is a flowchart illustrating a data input/output method according to an embodiment of the present inventive concept.

FIG. 6 is a flowchart illustrating a data input/output method according to an embodiment of the present inventive concept.

Referring to FIGS. 1 to 3 and 6, the data input/output method according to an embodiment of the present inventive concept may include operation S100 of receiving the enable signal En, operation S110 of generating the control signal CS, operation S120 of generating the variable voltage Vol, operation S130 of applying the variable voltage Vol, and operation S140 of outputting the current $I_{out}$.

In some embodiments of the present inventive concept, the memory controller 250 may transmit the enable signal En, which indicates whether the memory controller 250 is operating with the memory device 300 (or using the memory device 300), to the memory device 300. For example, the control circuit 351 included in the data input/output circuit 350 of the memory device 300 may receive the enable signal En in operation S100. The control circuit 351 may generate the control signal CS based on data determining whether the enable signal En is activated, a transistor to which the variable voltage Vol is applied, and the magnitude of the variable voltage Vol in operation S110. The variable voltage source 353 may be controlled by the control signal CS. For example, the control signal CS may include information on the variable voltage Vol to be generated by the variable voltage source 353. Based on the control signal CS, the variable voltage source 353 may generate the variable voltage Vol in operation S120. Then, the variable voltage source 353 may apply the generated variable voltage Vol to the driver 355 in operation S130. The driver 355 may output the current $I_{out}$ based on a driving signal and the applied variable voltage Vol in operation S140. Hereinafter, detailed description of contents and effects of the operations was previously given with reference to FIGS. 1 to 5, and descriptions that may be assumed to be repetitive or redundant might not be given or may be briefly discussed.

Accordingly, by the data input/output method according to an embodiment of the present inventive concept, data may be output by controlling the variable voltage in conjunction with whether the memory is operating.

FIGS. 7 and 8 are flowcharts illustrating a process of generating a control signal according to an embodiment of the present inventive concept.

Referring to FIGS. 1 to 3 and 6, the control circuit 351 may generate the control signal CS, which controls generation of the variable voltage Vol of the variable voltage source 353, according to whether the enable signal En is activated in operation S110.

Referring to FIG. 7, as an example, the transistors included in the driver 355, to which the variable voltage Vol is applied, may include NMOS transistors. First, the control circuit 351 may determine whether the enable signal En is in an active state, that is, whether the memory is operating in operation S111. When the enable signal En is in an inactive state, the control circuit 351 may generate the control signal CS controlling the variable voltage source 353 to generate the back bias voltage in operation S113. Accordingly, the input/output circuit of the memory may increase the operating speed of the device by reducing the pad capacitance of the memory that is not in operation, and may reduce the leakage currents by increasing the threshold voltages.

When the enable signal En received by the control circuit 351 is in an active state, the control circuit 351 may generate the control signal CS, which controls the variable voltage source 353, to generate the zero bias voltage or the positive bias voltage in operation S115. Accordingly, the input/output circuit of the memory may have the memory in use or to be operated smoothly operate or may reduce the pad capacitance by increasing the driving strength or reducing the driver size to increase the operating speed of the device.

Referring to FIG. 8, as an example, the transistors included in the driver 355, to which the variable voltage Vol is applied, may include PMOS transistors. Similarly, the control circuit 351 may determine whether the enable signal En is in an active state in operation S111. When the enable signal En is in an inactive state, the control circuit 351 may generate the control signal CS, which controls the variable voltage source 353, to generate the positive bias voltage in operation S117.

When the enable signal En, which is received by the control circuit 351, is in an active state, the control circuit 351 may generate the control signal CS controlling the variable voltage source 353 to generate the zero bias voltage or the back bias voltage in operation S119. Because description of the effects of controlling the variable voltage Vol through operations S117 and S119 was previously given with reference to FIG. 7, description thereof might not be given or may be briefly discussed.

According to some embodiments of the present inventive concept, the input/output circuit may obtain the above-described effects by setting the variable voltage to vary according to whether the memory is in use or operating.

Figure 9:
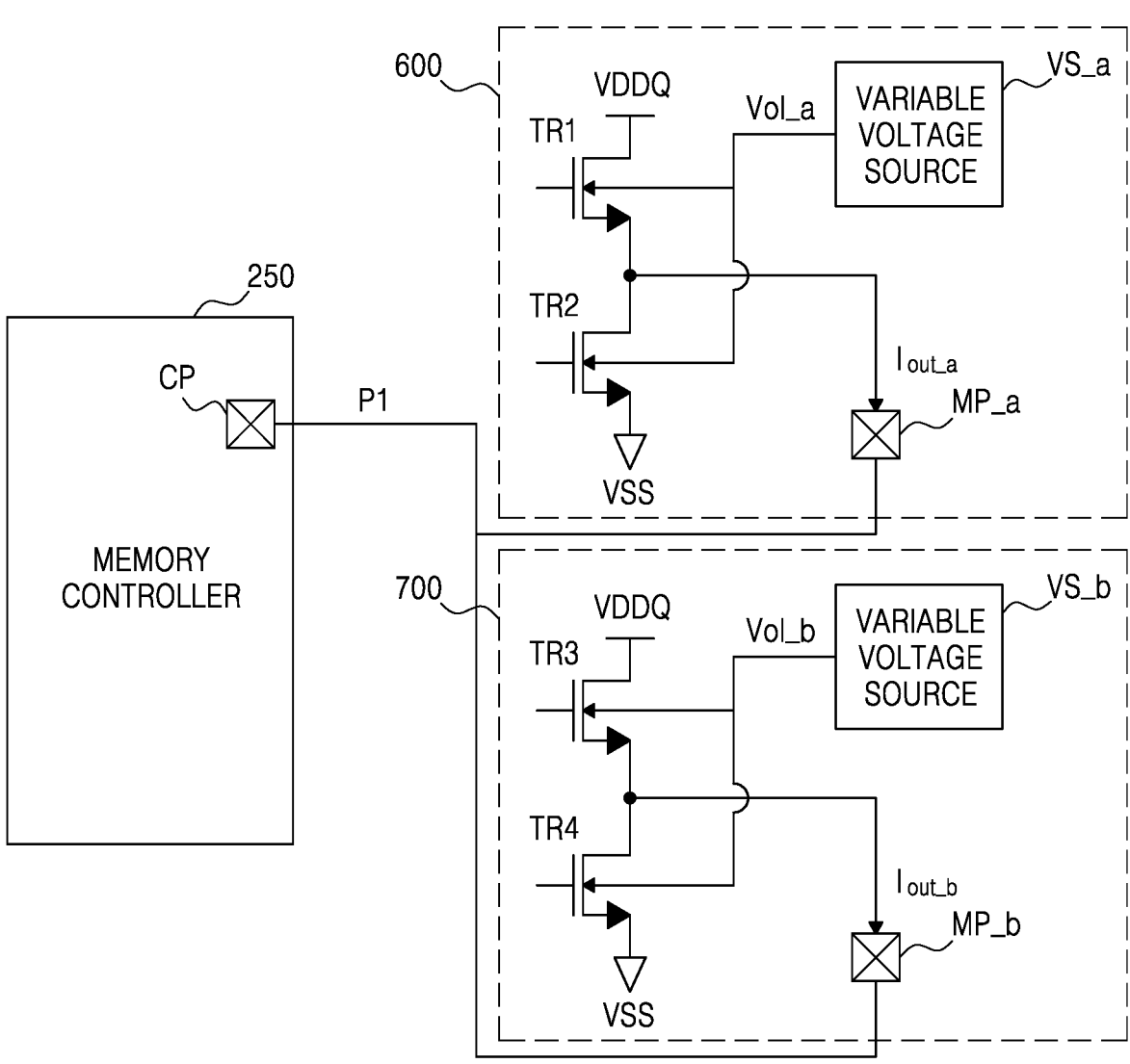
FIG. 9 is a diagram illustrating a memory device according to an embodiment of the present inventive concept.

FIG. 9 is a diagram illustrating a memory device according to an embodiment of the present inventive concept.

Referring to FIGS. 1 to 3, 5, and 9, the memory controller 250 may be connected to a plurality of memory dies (or may be referred to as memory devices or memory chips). As described above, the operating speed of the device may be increased by controlling the input/output circuit according to whether the plurality of memory dies are operating.

In some embodiments of the present inventive concept, an input/output circuit of a first memory die 600 may include a first variable voltage source VS_a generating a first variable voltage Vol_a, a first memory input/output pad MP_a, and a first transistor TR1 and a second transistor TR2 serially connected to each other to generate a first current $I_{out\_a}$ according to a driving signal. A second memory die 700 may include a second variable voltage source VS_b generating a second variable voltage Vol_b, a second memory input/output pad MP_b, and a third transistor TR3 and a fourth transistor TR4 serially connected to each other to generate a second current $I_{out}$ b according to a driving signal. The first variable voltage source VS_a and the second variable voltage source VS_b may receive a control signal, which controls generation of the first variable voltage Vol_a and the second variable voltage Vol_b, from a corresponding control circuit as described above with reference to FIGS. 2 and 3. Hereinafter, for convenience of description, the first to fourth transistors TR1 to TR4 may implemented as NMOS transistors, as an example.

The memory controller 250 may include a controller input/output pad CP, and the controller input/output pad CP may be connected to the first memory input/output pad MP_a and the second memory input/output pad MP_b through a wire PI to operate with the first memory die 600 and the second memory die 700.

In some embodiments of the present inventive concept, the memory controller 250 may use (for example, perform an input/output operation) either the first memory die 600 or the second memory die 700. For example, the memory controller 250 may be performing the input/output operation with the first memory die 600. At this time, the memory controller 250 might not perform the input/output operation with the second memory die 700. Therefore, in this case, as described above with reference to FIGS. 2 and 3, the first memory die 600 may receive the activated enabled signal En from the memory controller 250, may generate the first variable voltage Vol_a (for example, the zero bias voltage or the positive bias voltage) according to the above-described control operation, and may apply the first variable voltage Vol_a to bodies of the first and second transistors TR1 and TR2. The second memory die 700 may receive the deactivated enable signal En from the memory controller 250, may generate the second variable voltage Vol_b (for example, the back bias voltage) according to the above-described control operation, and may apply the second variable voltage Vol_b to bodies of the third and fourth transistors TR3 and TR4.

For example, the input/output circuit included in the memory chip (or memory die) may be controlled in parallel according to whether each of the corresponding memory chips operates. As described above with reference to FIGS. 2 and 3, pad capacitance of a memory chip that is not in use may be reduced by controlling a corresponding variable voltage, and power consumption may be reduced by reducing leakage current of the memory chip. In addition, a memory chip that is in use may smoothly operate by controlling a corresponding variable voltage. Further, driving strength of the memory chip may be increased and/or a driver size of the memory chip may be reduced to reduce pad capacitance of the memory chip.

Therefore, when a plurality of memory chips are connected through one channel, because pad capacitance of the channel may be reduced by reducing pad capacitance of memory chips excluding an operating memory chip in conjunction with whether memory chips are operating, an operating speed between the memory controller and the memory chips may increase.

However, the present inventive concept is not limited thereto. For example, the input/output circuit according to an embodiment of the present inventive concept may be widely implemented not only in memory chips but also in various devices capable of performing input/output operations (for example, data or signal input/output operations) with the controller.

Figure 10:
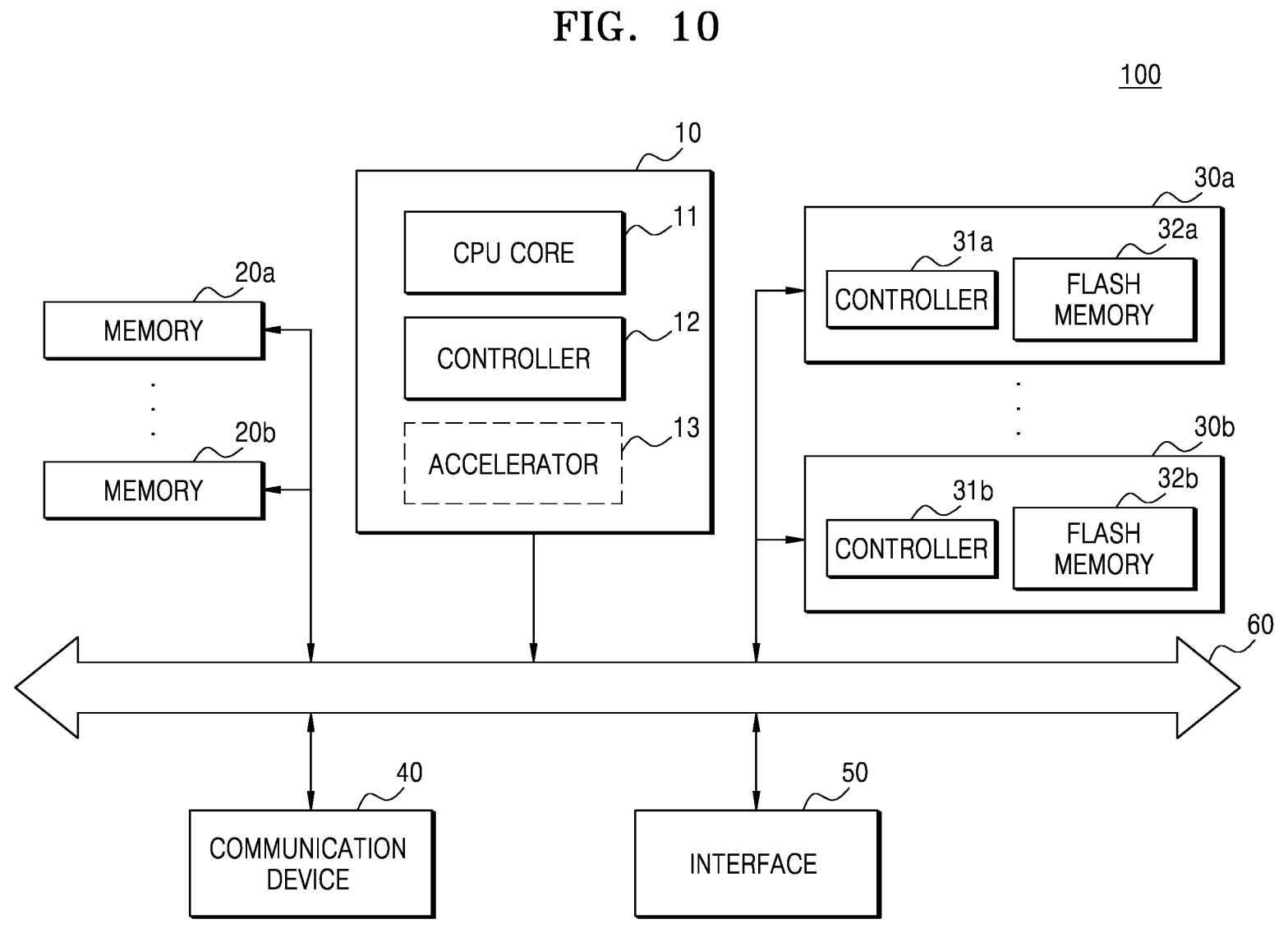

FIG. 10 is a diagram illustrating a system to which memory and/or a storage device according to an embodiment of the present inventive concept is applied.

The system 100 may include, for example, a mobile system such as a mobile phone, a smartphone, a tablet personal computer (PC), a wearable device, a healthcare device, or an Internet of things (IOT) device. However, the system 100 of FIG. 10 is not limited to the mobile system, and may include, for example, a personal computer, a laptop computer, a server, a media player, or an automotive device such as a navigation device.

Referring to FIG. 10, the system 100 may include a main processor 10, the memories 20a to 20b, and the storage devices 30a to 30b each including an input/output circuit according to an embodiment of the present inventive concept, and may further include at least one of a communication device 40 and/or an interface 50.

The main processor 10 may control an overall operation of the system 100, for example, operations of other components constituting the system 100. The main processor 10 may be implemented as a general-purpose processor, a dedicated processor, or an application processor.

The main processor 10 may include one or more CPU cores 11, and may further include a controller 12 controlling the memories 20a to 20b and/or the storage devices 30a to 30b. According to an embodiment of the present inventive concept, the main processor 10 may further include an accelerator block 13 as a dedicated circuit for high-speed data operation such as artificial intelligence (AI) data operation. The accelerator block 13 may include, for example, a graphics processing unit (GPU), a neural processing unit (NPU), and/or a data processing unit (DPU), and may be implemented as a separate chip that is physically independent of other components of the main processor 10. However, the present inventive concept is not limited thereto. For example, the accelerator block 13 may be implemented within the main processor 10.

The memories 20a to 20b each including the input/output circuit according to an embodiment of the present inventive concept may be used as main memory of the system 100, and may include, for example, volatile memory such as static random access memory (SRAM) and/or dynamic random access memory (DRAM) such as double data rate synchronous DRAM (DDR SDRAM) or low power DDR (LPDDR) SDRAM or non-volatile memory such as flash memory, magnetic RAM (MRAM), ferroelectric RAM (FeRAM), phase change RAM (PRAM), and resistive RAM (ReRAM). The memories 20a to 20b may be implemented in the same package as the main processor 10.

In addition, the storage devices 30a to 30b each including the input/output circuit according to an embodiment of the present inventive concept may function as non-volatile storage devices storing data regardless of power supply and may have relatively large storage capacity compared to the memories 20a to 20b. The storage devices 30a to 30b may include storage controllers 31a to 31b and non-volatile memory (NVM) storages 32a to 32b, which store data under control of the storage controllers 31a to 31b. For example, the NVM storages 32a to 32b may include V-NAND flash memory with a two-dimensional structure or a three-dimensional structure, or may include other types of non-volatile memory such as PRAM and/or ReRAM The storage devices 30a to 30b may be included in the system 100 while being physically separated from the main processor 10 or may be implemented in the same package as the main processor 10. In addition, the storage devices 30a to 30b may have a form such as a solid state device (SSD) or a memory card to be detachably coupled to other components of the system 100 through an interface such as an interface 50 to be described later. A standard protocol such as a universal flash storage (UFS), an embedded multimedia card (eMMC), or non-volatile memory express (NVMe) may be applied to the storage devices 30a to 30b. However, the present inventive concept is not limited thereto. The memories 20a to 20b and/or the storage devices 30a to 30b may input and output data in conjunction with an activation signal as described above, according to an embodiment of the present inventive concept.

The communication device 40 may transmit and receive signals to and from other devices outside the system 100 according to various communication protocols. The communication device 40 may include, for example, an antenna, a transceiver, and/or a modem.

The interface 50 may provide a connection between the system 100 and an external device that is connected to the system 100 to transmit and receive data to and from the system 100. The connection interface 50 may be implemented by one of various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, a universal serial bus (USB), a secure digital (SD) card, a multi-media card (MMC), an eMMC, a UFS, an eUFS, and a compact flash (CF) card interface.

A system bus 60 may be provided as an interconnector for providing a network in the system 100. Through the system bus 60, the main processor 10, the memories 20a to 20b, the communication device 40, the interface 50, and the storage devices 30a to 30b are electrically connected to each other and may exchange data with each other. However, the configuration of the system bus 60 is not limited thereto and may further include mediation units for efficient management.

However, the present inventive concept is not limited thereto. For example, the input/output circuit according to an embodiment of the present inventive concept may be widely implemented in various devices that are capable of performing input/output operations (for example, data or signal input/output operations) as well as memory or storage devices.

FIG. 11 is a diagram illustrating a multi-chip package 1000 according to an embodiment of the present inventive concept.

Referring to FIGS. 1 to 3, 9, and 11, the multi-chip package 1000 may include a package 1110, a plurality of external terminals 1140, and a resistor RZQ connected to a reference voltage (for example, the ground voltage VSS). The package 1110 may include a plurality of memory chips (for example, first to eighth memory chips 1121 to 1128) each including the input/output circuit according to an embodiment of the present inventive concept, which are stacked on a printed circuit board (PCB) 1150. In some embodiments of the present inventive concept, as described above with reference to FIGS. 1 to 3, each of the first to eighth memory chips 1121 to 1128 may include the data input/output circuit 350 of FIG. 2. The PCB 1150 may include a plurality of conductive layers and through-silicon vias (TSV) 1130 separated by insulating layers. The plurality of conductive layers and TSVs 1130 of the PCB 1150 may be respectively connected to the plurality of external terminals 1140 of the package 1110. For example, the plurality of external terminals 1140 of the package 1110 may be implemented as package balls or leads.

The multi-chip package 1000 may be implemented as a package, for example, a package on package (POP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a metric quad flat package (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

The multi-chip package 1000 may include a memory system providing high-capacity and high-speed memory chips. The first to eighth memory chips 1121 to 1128 may include, for example, non-volatile memory devices. Each of the non-volatile memory devices may include, for example, flash memory, phase-change random access memory (PRAM), resistive RAM (ReRAM), magnetic RAM (MRAM), ferroelectric RAM (FeRAM), electrically erasable programmable read-only memory (EEPROM), nano floating gate memory (NFGM), or polymer RAM (PoRAM). However, the present inventive concept is not limited thereto. In some embodiments of the present inventive concept, the multi-chip package 1000 may include non-volatile memory chips and an SSD, an embedded UFS memory card, an eMMC, a compact flash (CF), secure digital (SD), Micro-SD, Mini-SD, extreme digital (xD), or a memory stick including a memory controller (or a buffer chip) controlling the non-volatile memory chips.

According to an embodiment of the present inventive concept, the first to eighth memory chips 1121 to 1128 according to an embodiment of the present inventive concept may include a plurality of volatile memory devices. Each of the plurality of volatile memory devices may include, for example, DRAM, SRAM, mobile DRAM, DDR SDRAM, LPDDR SDRAM, graphics DDR (GDDR) SDRAM, or Rambus DRAM (RDRAM). However, the present inventive concept is not limited thereto. In some embodiments of the present inventive concept, the multi-chip package 1000 may include a DRAM multi-chip package (DRAM MCP) or high bandwidth memory (HBM).

In some embodiments of the present inventive concept, the first to eighth memory chips 1121 to 1128 may include different memory devices from each other such as the non-volatile memory devices and the volatile memory devices.

The first to eighth memory chips 1121 to 1128 may be connected to neighboring memory chips through bonding wires B1 to B7. For example, the first memory chip 1121 may be connected to the second memory chip 1122 through the bonding wire B1. The second memory chip 1122 may be connected to the third memory chip 1123 through the bonding wire B2. In the same way, up to the eighth memory chip 1128, the third memory chip 1123 through the eighth memory chip 1128 may be connected to each other through bonding wires B3 to B7. In the current embodiment, it is illustrated that the package 1110 includes eight memory chips. However, the present inventive concept is not limited thereto.

The first to eighth memory chips 1121 to 1128 may include input/output pads. The input/output pads may include data input/output pads (hereinafter, referred to as "DQ pads"), impedance adjustment pads (hereinafter, referred to as "ZQ pads"), command pads, and address pads. The DQ pads 1161 to 1168 may be connected to one another by the bonding wires B1 to B7. In some embodiments of the present inventive concept, each of the DQ pads 1161 to 1168 included in the first to eighth memory chips 1121 to 1128 may correspond to the data input/output pad 359 of FIG. 2. The first to eighth memory chips 1121 to 1128 may be stacked in a stepped shape so that the DQ pads 1161 to 1168 are exposed for bonding wiring. With respect to input/output pads, the term "pad" broadly refers to an electrical interconnection to an integrated circuit, and may include, for example, pins or other electrical contact points on an integrated circuit.

The first memory chip 1121 may be arranged at the lowermost end of the first to eighth memory chips 1121 to 1128, and may be connected to the plurality of conductive layers and TSVs 1130 of the PCB 1150 to be combined with an external terminal 1140 of the package 1110. Accordingly, the first memory chip 1121 may be referred to as a master chip, and the second to eighth memory chips 1122 to 1128 may be referred to as slave chips. The first memory chip 1121 may include a ZQ pad 1160, and the ZQ pad 1160 may be connected to the plurality of conductive layers and TSVs 1130 of the PCB 1150 through a bonding wire A1 and may be connected to the external terminal 1140 of the package 1110. The external terminal 1140, which is connected to the ZQ pad 1160, may be referred to as a ZQ terminal 1140. The resistor RZQ may be connected between the ZQ terminal 1140 and the reference voltage (for example, the ground voltage VSS).

In addition, each of the second to eighth memory chips 1122 to 1128 may include a ZQ pad. The ZQ pads of the second to eighth memory chips 1122 to 1128 may be connected to the above-described power supply voltage VDDQ. The power supply voltage VDDQ may drive a ZQ engine, an input driver, and an output driver (for example, the driver 355).

In some embodiments of the present inventive concept, some of the first to eighth memory chips 1121 to 1128 (hereinafter, referred to as, e.g., operating memory chips) may perform input/output operations with the memory controller. The memory controller may transmit a signal (for example, a command signal) to the operating memory chips to perform the input/output operations (e.g., to activate the operating memory chips). As described above with reference to FIGS. 1 to 3 and 9, the data input/output circuit 350 of the operating memory chips may receive the enable signal En included in the signal to activate a memory chip. The data input/output circuit 350 may receive the activated enable signal En, may generate the control signal CS to control the generation of the variable voltage Vol, and may apply the generated variable voltage Vol to the driver 355 to generate the current $I_{out}$. The generated current $I_{out}$ may be transmitted to the memory controller through a corresponding DQ pad.

In some embodiments of the present inventive concept, memory chips (hereinafter, referred to as non-operating memory chips) excluding the operating memory chips among the first to eighth memory chips 1121 to 1128 might not perform the input/output operations with the memory controller. Similarly, as described above with reference to FIGS. 1 to 3 and 9, the data input/output circuit 350 of the non-operating memory chips may receive the deactivated enable signal En, may generate the control signal CS to control the generation of the variable voltage Vol, and may apply the generated variable voltage Vol to the driver 355. Because detailed description of the configuration and operation of the data input/output circuit 350 of the operating memory chips and the non-operating memory chips was previously given, detailed description thereof will not be given.

For example, the multi-chip package 1000 according to an embodiment of the present inventive concept may control the operating memory chips and the non-operating memory chips in parallel through a memory chip controlling the variable voltage that is to be applied to the driver in conjunction with whether the memory chip is activated. As a result, performance of the package may be increased by reducing pad capacitance and leakage currents of the non-operating memory chips and increasing driving strength of the operating memory chips and/or reducing a size of the driver.

While the present inventive concept has been described with reference to example embodiments thereof, it will be understood by those of ordinary skill in the art that various changes in form and details may be made thereto without departing from the spirit and scope of the present inventive concept.

What is claimed is:

1. A device comprising:
an input/output circuit,
wherein the input/output circuit comprises:
a control circuit configured to receive a signal indicating whether the device is activated;
a variable voltage source configured to generate a variable voltage according to a control operation of the control circuit based on the signal received by the control circuit;
an output driver including a pull-up transistor and a pull-down transistor; and
a pad configured to output a current that is generated by the output driver,
wherein the variable voltage source is configured to provide the variable voltage to a body of the pull-up transistor and a body of the pull-down transistor.

2. The device of claim 1, wherein the control circuit is configured to control the variable voltage source to generate a reference voltage, when the signal is in an active state.

3. The device of claim 1, wherein a magnitude of the variable voltage generated by the variable voltage source is adjusted based on a preset value or an external control.

4. The device of claim 1, wherein each of the pull-up transistor and the pull-down transistor is a n-channel metal oxide semiconductor (NMOS) transistor.

5. The device of claim 4, wherein the control circuit is configured to control the variable voltage source to generate a voltage lower than a reference voltage, when the signal is in an inactive state.

6. The device of claim 4, wherein the control circuit is configured to control the variable voltage source to generate a voltage higher than a reference voltage, when the signal is in an active state.

7. The device of claim 1, wherein the variable voltage source is configured to generate a variable voltage that varies from a voltage lower than a reference voltage to a voltage higher than a power supply voltage.

8. The device of claim 1, wherein each of the pull-up transistor and the pull-down transistor is p-channel metal oxide semiconductor (PMOS) transistor.

9. The device of claim 8, wherein the control circuit is configured to control the variable voltage source to generate a voltage higher than a reference voltage, when the signal is in an inactive state.

10. The device of claim 8, wherein the control circuit is configured to control the variable voltage source to generate a voltage lower than a reference voltage, when the signal is in an active state.

11. A method of inputting and outputting data from a device, the method comprising:
receiving an enable signal that indicates whether the device is activated;
generating a control signal in response to the enable signal;
generating a variable voltage based on the control signal;
applying the variable voltage to a first body of a pull-up transistor and a second body of a pull-down transistor; and
outputting a current that is generated by the pull-up transistor and the pull-down transistor.

12. The method of claim 11, wherein the generating of the control signal comprises generating the control signal so that the variable voltage is generated as a reference voltage, when the enable signal is in an active state.

13. The method of claim 11, wherein the generating of the variable voltage comprises generating a variable voltage that varies from a voltage lower than a reference voltage to a voltage higher than a power supply voltage.

14. The method of claim 11, wherein the pull-up transistor comprises a first NMOS transistor and the pull-down transistor comprises a second NMOS transistor.

15. The method of claim 14, wherein the generating of the control signal comprises generating the control signal so that the variable voltage is lower than a reference voltage, when the enable signal is in an inactive state.

16. The method of claim 14, wherein the generating of the control signal comprises generating the control signal so that the variable voltage is higher than a reference voltage, when the enable signal is in an active state.

17. The method of claim 11, wherein the pull-up transistor comprises a first PMOS transistor and the pull-down transistor comprises a second PMOS transistor, and
wherein the generating of the control signal comprises generating the control signal so that the variable voltage is higher than a reference voltage, when the enable signal is in an inactive state.

18. A system comprising:

a first chip; and a controller electrically connected to the first chip, wherein an input/output circuit of the first chip comprises:

a control circuit configured to receive, from the controller,
an enable signal that indicates whether the first chip is
activated;

a variable voltage source configured to generate a variable
voltage according to a control operation of the control
circuit based on the enable signal; an output driver including a pull-up transistor and a
pull-down transistor; and a pad configured to output a current that is generated by
the output driver, wherein the variable voltage source provides the variable
voltage to a body of the pull-up transistor and a body
of the pull-down transistor.

19. The system of claim 18, wherein the control circuit
controls the variable voltage source to generate a reference
voltage, when the enable signal is in an active state.

20. The system of claim 18, wherein each of the pull-up
transistor and the pull-down transistor comprises an NMOS
transistor, and wherein the control circuit controls the variable voltage
source to generate a voltage lower than a reference voltage, when the enable signal is in an inactive state.

* * * * *